US010867532B2

(12) United States Patent
Jeon

(10) Patent No.: US 10,867,532 B2
(45) Date of Patent: Dec. 15, 2020

(54) FLEXIBLE DISPLAY DEVICE THAT PREVENTS DIFFERENCE IN THE VIEWING ANGLE BETWEEN THE BEND PORTION AND FLAT PORTION

(71) Applicant: LG Display Co., Ltd., Seoul (KR)

(72) Inventor: In-Young Jeon, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 155 days.

(21) Appl. No.: 16/216,591

(22) Filed: Dec. 11, 2018

(65) Prior Publication Data

US 2019/0197924 A1 Jun. 27, 2019

(30) Foreign Application Priority Data

Dec. 22, 2017 (KR) .......................... 10-2017-0178556

(51) Int. Cl.
*G09F 9/30* (2006.01)
*H01L 51/00* (2006.01)
*H01L 51/52* (2006.01)
*H01L 51/50* (2006.01)

(52) U.S. Cl.
CPC .......... *G09F 9/301* (2013.01); *H01L 51/0097* (2013.01); *H01L 51/5012* (2013.01); *H01L 51/524* (2013.01); *H01L 51/5256* (2013.01); *H01L 51/5275* (2013.01); *B32B 2255/20* (2013.01); *H01L 2251/5338* (2013.01)

(58) Field of Classification Search
CPC ............... G06F 1/1652; H01L 51/0097; H01L 2251/5338; H01L 51/5237; H05K 1/028
See application file for complete search history.

(56) References Cited

U.S. PATENT DOCUMENTS

| 10,069,102 B2* | 9/2018 | Lee ..................... H01L 51/5237 |
| 2011/0164308 A1* | 7/2011 | Arsenault ............. G02F 1/0147 |
| | | 359/322 |
| 2014/0231763 A1* | 8/2014 | Kim ....................... H01L 51/56 |
| | | 257/40 |
| 2015/0001483 A1 | 1/2015 | Namkung et al. |
| 2016/0126496 A1 | 5/2016 | Wang et al. |
| 2016/0293672 A1 | 10/2016 | Yun et al. |
| 2017/0229674 A1 | 8/2017 | Jin et al. |
| 2019/0181365 A1* | 6/2019 | Choi ....................... H01L 51/56 |

FOREIGN PATENT DOCUMENTS

| CN | 101931057 A | 12/2010 |
| CN | 103915480 A | 7/2014 |
| CN | 105374847 A | 3/2016 |
| CN | 106023810 A | 10/2016 |

(Continued)

*Primary Examiner* — Tracie Y Green

(74) *Attorney, Agent, or Firm* — Birch, Stewart, Kolasch & Birch, LLP

(57) ABSTRACT

A flexible display device including a substrate with an active area having a bending portion and a flat portion, and a peripheral area surrounding the active area; a first emission unit located in the bending portion; a second emission unit located in the flat portion; a first protective layer covering the second emission unit; an optical stack covering the first emission unit and including two or more interfaces having a difference in an index of refraction of 0.1 or more; and a second protective layer covering the first protective layer and the optical stack together.

20 Claims, 14 Drawing Sheets

(56) References Cited

FOREIGN PATENT DOCUMENTS

| | | |
|---|---|---|
| CN | 206322696 U | 7/2017 |
| CN | 107437400 A | 12/2017 |
| CN | 107482038 A | 12/2017 |
| TW | 201640466 A | 11/2016 |
| WO | WO 2014/001046 A1 | 1/2014 |
| WO | WO 2016/124594 A1 | 8/2016 |

* cited by examiner

<Out-coupling Curve>

FLEXIBLE DISPLAY DEVICE THAT PREVENTS DIFFERENCE IN THE VIEWING ANGLE BETWEEN THE BEND PORTION AND FLAT PORTION

CROSS-REFERENCE TO RELATED APPLICATION

Pursuant to 35 U.S.C. § 119(a), this application claims the benefit of an earlier filing date and priority to Korean Application No. 10-2017-0178556 filed in the Republic of Korea on Dec. 22, 2017, the contents of which are incorporated by reference herein in its entirety.

BACKGROUND OF THE INVENTION

Field of the Invention

The present invention relates to a flexible display device, and more particularly, to a flexible display device having an improved viewing angle in a bending portion that has a curvature.

Discussion of the Related Art

With the advent of the information age, the field of displays that visually display electrically conveyed information signals has rapidly been developed. In response, various flat panel display devices having excellent performance, such as thinner and lighter designs and less power consumption, have been developed and are rapidly replacing conventional cathode ray tubes (CRTs).

Representative examples of such flat panel display devices include a liquid crystal display (LCD) device, a plasma display panel (PDP) device, a field emission display (FED) device, an organic light-emitting display (OLED) device, and a quantum dot light-emitting display (OLED) device. Among these, a field emission display device, such as an organic light-emitting display device, is considered a competitive application because it requires no separate light source and enables device compactness and vivid color display.

The field emission display device obviates a light source unit and can be made flexible, and therefore has also been proposed in the form of a flexible display device, which is bendable or foldable, rather than simply having a flat panel shape. Such a flexible display device implements display even in a portion thereof having a curvature, for example, a bending portion.

In a general flexible display device, a flat portion and a bending portion are included in the same active area and have the same pixel structure. However, when this configuration is applied to an actual product, variation in the viewing angle may occur in the bending portion compared to the flat portion, which causes the bending portion to appear relatively dark.

SUMMARY OF THE INVENTION

Accordingly, the present invention is directed to a flexible display device that substantially obviates one or more problems due to limitations and disadvantages of the related art.

One object according to an embodiment of the present invention is to provide a flexible display device, which has an improved viewing angle in a bending portion thereof and prevents a difference in viewing angle between the bending portion and a flat portion thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention relates to a flexible display device, in which a flat portion and a bending portion have different structures with respect to an encapsulation unit, which prevents luminance deterioration attributable to variation in the viewing angle in the bending portion according to an embodiment of the present invention.

It is to be understood that both the foregoing general description and the following detailed description according to an embodiment of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
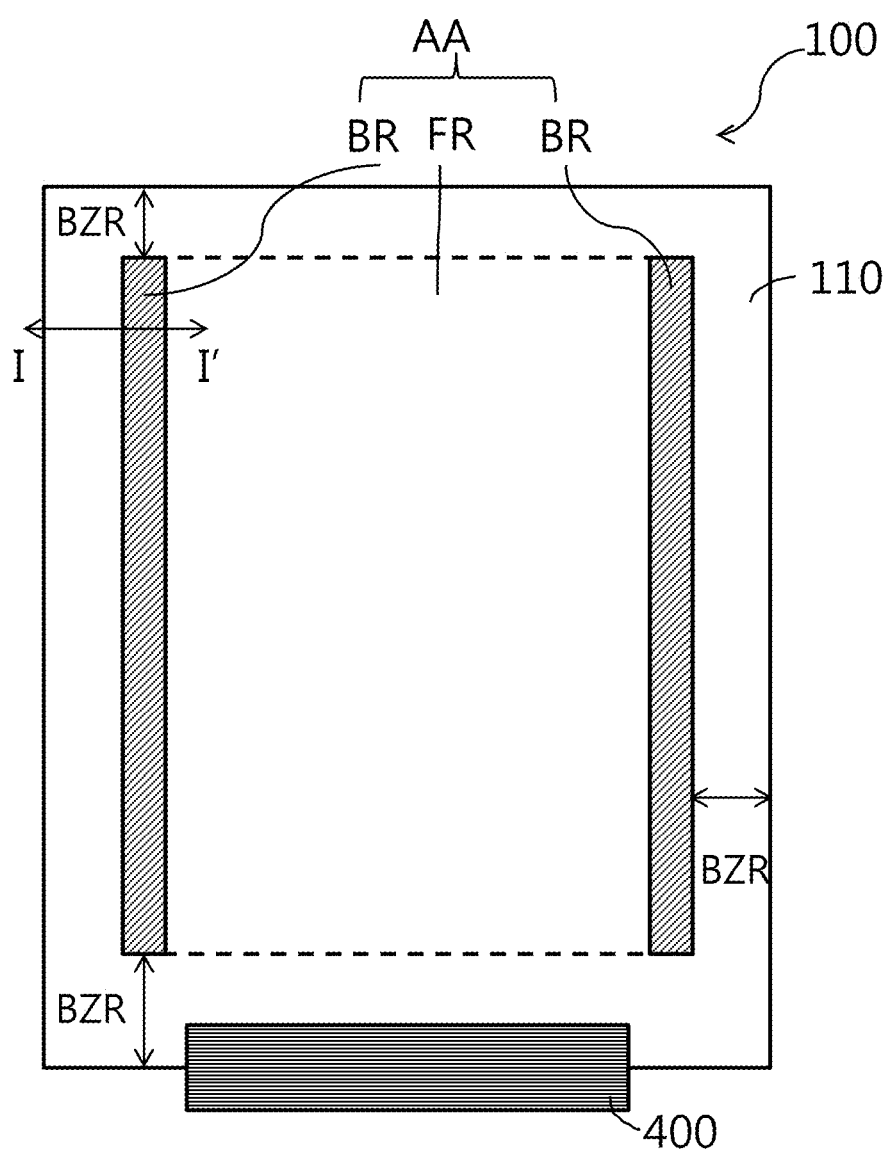
FIG. 1 is a plan view illustrating a flexible display device according to an embodiment of the present invention.

The advantages and features of the present invention and the way of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

It will be understood that shapes, sizes, ratios, angles, and numbers lengths, which are illustrated in the drawings for explaining various embodiments of the present invention, are given by way of example, and the present invention is not limited to the illustrations of the drawings. Wherever possible, the same reference numbers will be used throughout the drawings to refer to the same or like parts. In addition, in the following description of the embodiments, a detailed description of known functions and configurations incorporated herein will be omitted when it may impede the understanding of the embodiments. When the terms "comprises," "includes," "has", and the like are used in this specification, other elements may be added unless the term "only" is used. In addition, the singular forms "a," "an," and "the" are intended to include the plural forms as well, unless the context clearly indicates otherwise.

In the interpretation of constituent elements included in the various embodiments of the present invention, the constituent elements are interpreted as including an error range even if there is no explicit description thereof. In the description of the various embodiments of the present invention, when describing positional relationships, for example, when the positional relationship between two parts is described using "on", "above", "below", "aside", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In this specification, an organic light-emitting element may include an organic layer, which includes an organic emission layer, between first and second electrodes thereof opposing each other, and the organic layer may further include a hole injection layer and a hole transport layer, which are provided below the organic emission layer, and an electron transport layer and an electron injection layer, which are provided above the organic emission layer. In addition, other organic layers, such as an auxiliary layer and a control layer, may further be included depending on the structure or design of the organic light-emitting element.

Figure 2:
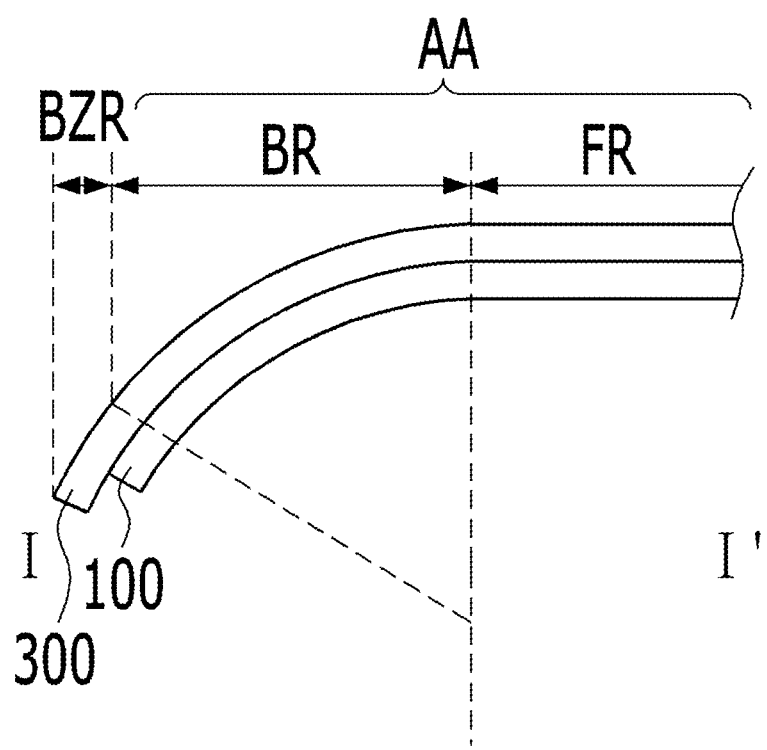
FIG. 2 is a schematic cross-sectional view taken along line I-I' of FIG. 1.

FIG. 1 is a plan view and FIG. 2 is a cross-sectional view illustrating a flexible display device according to an embodiment of the present invention. As illustrated in FIG. 1, the flexible display device includes an organic light-emitting display panel 100, in which a display image is produced, and a glass cover 300 (FIG. 2), which is located above the organic light-emitting display panel 100 to protect the organic light-emitting display panel 100 and which is adjustable in curvature.

As illustrated in FIG. 2, the glass cover 300 is transparent and has a predetermined or higher hardness so as to be molded to have a side portion with a curvature. In addition, the organic light-emitting display panel 100 is located inside and adhered to the glass cover 300, so that the shape of the glass cover 300 having a curvature is reflected on the organic light-emitting display panel 100 and the organic light-emitting display panel 100 maintains the shape thereof. The reason why the shape of the glass cover 300 is defined first in order to realize the shape of the organic light-emitting display panel 100 is because the organic light-emitting display panel 100 cannot maintain the shape thereof alone since the organic light-emitting display panel 100 includes an array provided on a flexible substrate, which is less than one-tenth as thick as the glass cover 300.

Referring to FIGS. 1 and 2, in the flexible display, a substrate 110 of the organic light-emitting display panel 100 includes a flat portion FR and a bending portion BR defined together in an active area AA, and a peripheral area NA is located to surround the active area AA including the two. The bending portion BR is illustrated in FIG. 2 as being located at opposite edges of the active area AA to take the form of an edge-bending portion, but the flexible display device of the present invention is not limited to this example.

That is, the bending portion BR, which is foldable or curved, can be folded in half at the center of the substrate 110, or be folded along a straight line or an oblique line. However, the bending portion BR can have a fixed curved shape and the flat portion FR can have a fixed flat shape. Since the bending portion BR and the flat portion FR have different configurations, it is desirable for the bending portion BR to have a fixed curved shape and for the flat portion FR to have a fixed flat shape in order to maximize the efficiency of such different configurations.

The example of FIG. 2, in which the bending portion BR is provided along both edges of the active area AA, can be applied to a small item, such as a cellular phone, an E-book or a navigation system. Further, the glass cover 300 has an area wider than that of the organic light-emitting display panel 100 in order to protect the organic light-emitting display panel 100.

In addition, the peripheral area NA outside the active area AA is also referred to as a bezel area BZR, which is hidden by a structural member known as a bezel. In the bezel area BZR, a plurality of metal lines and a pad member are provided to transmit signals to the active area AA. The pad member is connected to a flexible printed circuit board 400 configured to be folded towards the rear surface of the substrate 110. Further, the substrate 110, which has an array in the active area AA, is accommodated in the structural member, such as the bezel, so that the peripheral area BZR, the side surface, and the lower surface of the substrate 110 are hidden by the structural member.

Figure 3:
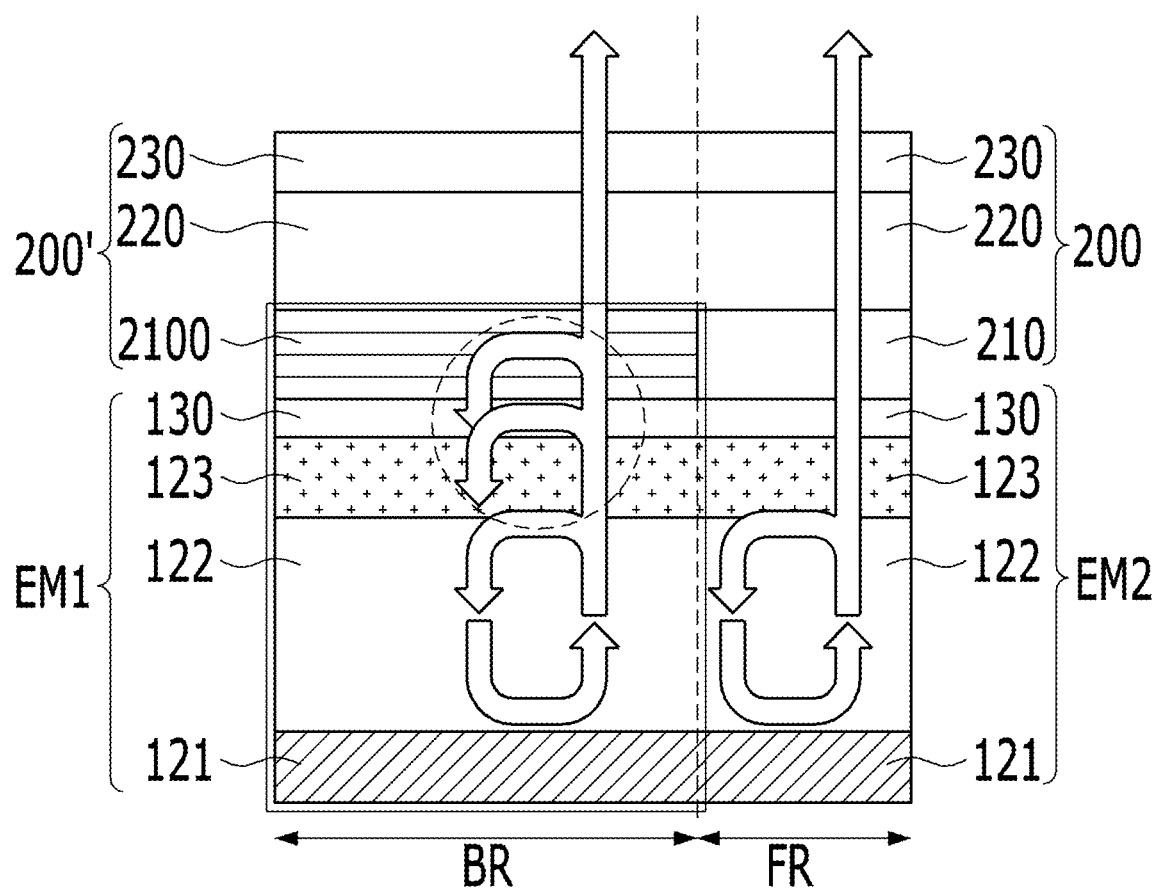
FIG. 3 is a cross-sectional view illustrating the unfolded state of a flat portion and a bending portion of an organic light-emitting display panel of FIG. 2.
Figure 4:
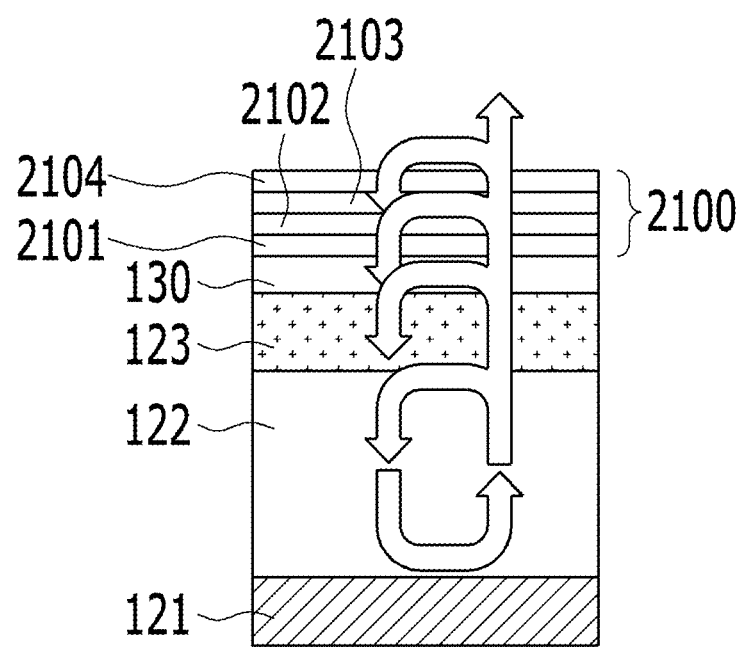
FIG. 4 is a cross-sectional view illustrating an organic light-emitting element and an upper structure thereof in a bending portion of FIG. 3.

Next, FIG. 3 is a cross-sectional view illustrating the unfolded state of the flat portion FR and the bending portion BR of the organic light-emitting display panel of FIG. 2, and FIG. 4 is a cross-sectional view illustrating the organic light-emitting element and an upper structure thereof in the bending portion BR of FIG. 3.

As illustrated in FIGS. 3 and 4, the organic light-emitting display panel 100 according to an embodiment of the present invention includes a first emission unit EM1 and a second emission unit EM2, which are provided respectively in the bending portion BR and the flat portion FR. In addition, each of the first emission unit EM1 and the second emission unit EM2 includes a first electrode 121, an organic layer 122 including an organic emission layer, a second electrode 123, and a capping layer 130 on the second electrode 123. FIGS. 3 and 4 illustrate that not only the flat portion FR but also the bending portion BR are in the flat state at the time of manufacture, so that the second and first emission units EM2 and EM1 and an upper structure thereof are provided thereon.

The structure in which the first electrode 121, the organic layer 122, and the second electrode 123 are stacked is referred to as a field emission element. The capping layer 130 covers the top of the field emission element to protect the field emission element, and is configured to discharge light emitted from the field emission element at a predetermined or higher transmittance thereof, without the loss of light.

In more detail, the capping layer 130 serves as a light-emitting layer in consideration of the optical characteristics thereof. In addition, the capping layer 130 is formed of a transparent insulation layer that directly discharges light from the field emission element, and is mainly formed of an organic layer containing a component of the organic layer 122 of the field emission element.

In the bending portion BR having a curvature, a loss of luminance may occur when the viewing angle varies in the bending portion BR. Therefore, in order to compensate for the loss of luminance, in the present invention, a second encapsulation unit 200' and a first encapsulation unit 200, which are respectively provided on the first and second emission units EM1 and EM2 in the bending portion BR and the flat portion FR, have different configurations.

In addition, the outermost curved region of the bending portion BR forms a boundary with the bezel area BZR, and the angle between the normal line at the bending portion BR and the normal line at the flat portion FR ranges from 20 degrees to 50 degrees. The bending portion BR is gently curved to allow an image to be visible as when viewing the flat portion FR from the front side.

More specifically, in the flat portion FR, the first encapsulation unit 200 is provided on the second emission unit EM2, and includes a first protective layer 210 formed of an inorganic material, a second protective layer 220 formed of an organic material, and a third protective layer 230 formed of an inorganic material. The first encapsulation unit 200 is provided at the uppermost position in order to protect the organic light-emitting display panel 100, and is configured by alternately stacking one or more pairs of inorganic and organic layers so that the outermost layer is an inorganic layer.

Further, the illustrated example corresponds to the minimum configuration of the first encapsulation unit 200. Here, the first and third protective layers 210 and 230 are inorganic layers having a thickness ranging from about 0.8 μm to 3 μm, and function to prevent moisture permeation and protect the inside thereof from outside air. The second protective layer 220 is an organic layer between the first and third protective layers 210 and 230, and functions to cover impurities generated during processing or remaining in an inner array so as to prevent the impurities from having an adverse effect on other layers. Also, the second protective layer 220 is substantially thicker than the first and third protective layers 210 and 230, and has a thickness of 15 μm or less, which enables surface planarization.

Further, the first protective layer 210 and the third protective layer 230, which are inorganic layers, may be formed of any one of a silicon oxide (SiOx) layer, a silicon nitride (SiNx) layer, a silicon oxide nitride (SiONx) layer, and a transparent metal oxide layer. The metal oxide layer is formed of TiOx, AlOx, ZnOx, or ZrOx, for example, but is not limited thereto. Also, the metal oxide layer may be replaced with any other metal oxide layer as long as it remains transparent and effectively prevents moisture permeation.

In the bending portion BR, an optical stack 2100 is provided in the same layer as the first protective layer 210 in the flat portion FR to cover the first emission unit EM1, and may include two or more interfaces having a difference in index of refraction of 0.1 or more. Thus, the optical stack 2100 in the bending portion BR is formed by stacking at least three inorganic layers, which have a difference in index of refraction of 0.1 or more, such that the inorganic layers are close to each other. Here, the difference in index of refraction may be 0.14 or more.

In addition, it is desirable to increase the difference in index of refraction between the interfaces in order to increase out-coupling caused by repeated reflection at the interfaces, but the respective optical layers of the optical stack 2100 are selected from among materials that function as protective layers for preventing moisture permeation. For example, as illustrated in FIG. 4, the optical stack 2100 may include a first optical layer 2101 provided in contact with the capping layer 130 and having a first index of refraction n1, a second optical layer 2102 provided on the first optical layer 2101 and having a second index of refraction n2, which is lower than the first index of refraction n1 by 0.1 or more, and a third optical layer 2103 provided on the second optical layer 2102 and having a third index of refraction n3, which is higher than the second index of refraction n2 by 0.1 or more.

As illustrated, the optical stack 2100 may include at least three optical layers. Alternatively, as illustrated in FIG. 4, the optical stack 2100 may further include a fourth optical layer 2104 having a fourth index of refraction n4, which is lower than that of the third optical layer 2103 by 0.1 or more, so that the optical stack 2100 may include four or more optical layers. Here, the layers having low indices of refraction may have the same index of refraction, and the layers having high indices of refraction may have the same index of refraction, without being limited thereto. Also, the indices of refraction of the respective adjacent optical layers can be adjusted so as to be different from each other since the loss of light may occur due to total reflection at portions of the respective optical layers.

As described above, the optical stack 2100 includes a layer having a low index of refraction and a layer having a high index of refraction alternately repeated, but is not limited thereto. For example, the optical layers 2101, 2102, 2103 and 2104 included in the optical stack 2100 may include a stack of layers including a first low-refractive-index layer, a second low-refractive-index layer having an index of refraction, which is lower than that of the first low-refractive-index layer by 0.1 or more, a first high-refractive-index layer having an index of refraction, which is higher than that of the second low-refractive-index layer by 0.1 or more, and a second high-refractive-index layer having an index of refraction, which is higher than that of the first high-refractive-index layer by 0.1 or more. In order to improve the reflection efficiency of each interface in the second encapsulation unit 200', more particularly, in the optical stack 2100 in the bending portion BR, a difference in index of refraction between adjacent layers is considered. Improved out-coupling may not be realized by reflection at the interface of the first protective layer 210 in the flat portion FR since the first protective layer 210 formed in a single layer does not exhibit a difference in index of refraction.

In addition, light from the first and second emission units EM1 and EM2 can substantially be emitted from the organic layer 122 including an emission layer, and be directed in all directions including not only the upward direction but also the downward direction. In a top-emission-type structure as illustrated, light directed downwards from the organic layer 122 is reflected from the surface of the first electrode 121, which contains a reflective metal, so as to be directed upwards, which minimizes the loss of light. Here, the second electrode 123 may be a transparent electrode or a semi-transparent electrode having a light-transmitting property so as to transmit and discharge the light directed from the underside thereof.

In the flexible display device according to an embodiment of the present invention, the single first protective layer 210 is provided on the second emission unit EM2 in the flat portion FR, whereas the optical stack 2100, which includes three or more optical layers 2101, 2102, 2103 and 2104 having at least two interfaces in which a difference in index of refraction at each interface is 0.1 or more, is provided on the first emission unit EM1 in the bending portion BR. Thus, the bending portion BR can increase the amount of emission of light owing to repeated emission and reflection of light at two or more interfaces having a difference in index of refraction. That is, the optical stack 2100 in the bending portion BR can discharge an increased amount of light compared to the first protective layer 210 of the flat portion FR in the same layer. In this way, it is possible to compensate for luminance deterioration attributable to variation in the viewing angle in the bending portion BR having a curved shape.

In the flexible display device according to an embodiment of the present invention, unlike the flat portion FR, the optical stack 2100 in the bending portion BR may include at least two interfaces having a difference in index of refraction, so that reflection can be repeatedly implemented at respective interfaces between adjacent layers, at which a difference in index of refraction is 0.1 or more, and resonance of light may occur at the interfaces, which may increase the amount of light to be discharged outwards from the emission side.

Through the resonance of light, the amount of light generated by the emission layer in the bending portion BR can be effectively increased, which increases the efficiency with which light is emitted outwards. Here, all of the layers constituting the optical stack 2100 are inorganic layers capable of preventing moisture permeation. Similar to the first protective layer 210 described above, the layers of the optical stack 2100 may be formed of a silicon oxide (SiOx) layer, a silicon nitride (SiNx) layer, a silicon oxide nitride (SiONx) layer, or a metal oxide layer, and the proportion of silicon, oxygen or nitrogen thereof can be adjusted so that the difference in index of refraction between adjacent layers is 0.1 or more.

The reason why the optical stack 2100 is selectively provided in the bending portion BR is as follows. The optical stack 2100 is provided on the first emission unit EM1 in the bending portion BR so as to increase the luminous efficacy of the bending portion BR compared to that of the flat portion FR. As illustrated in FIGS. 3 and 4, the bending portion BR in the flat state can be visibly brighter than the flat portion FR. However, since the bending portion BR remains in the curved state in an actual device so as to have a predetermined curvature unlike the flat portion FR, the high luminous efficacy of the bending portion BR may be canceled out by luminance deterioration attributable to variation in the viewing angle in the bending portion BR, which may allow a viewer to perceive an amount of light in the bending portion BR similar to that in the flat portion FR.

Figure 5A:
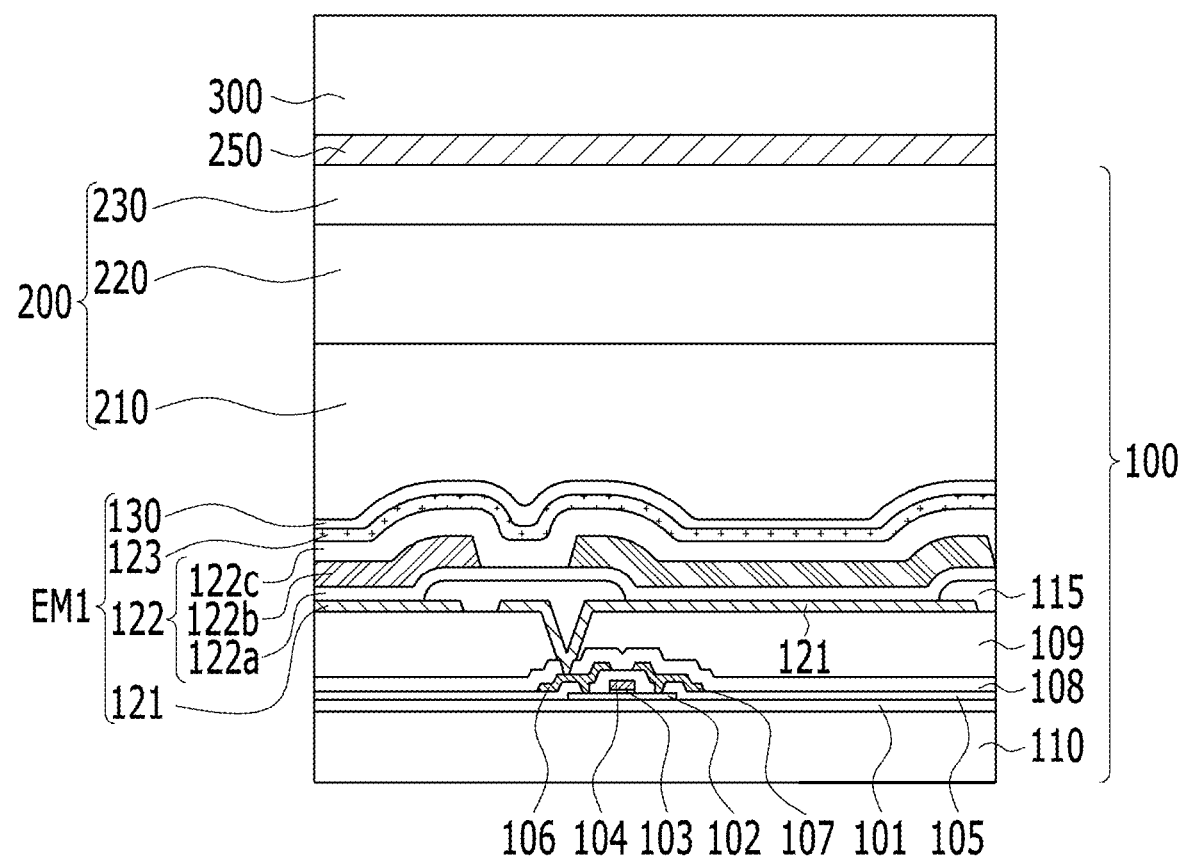
FIGS. 5A and 5B are cross-sectional views illustrating a flat portion and a bending portion of a flexible display device according to an embodiment of the present invention.
Figure 5B:
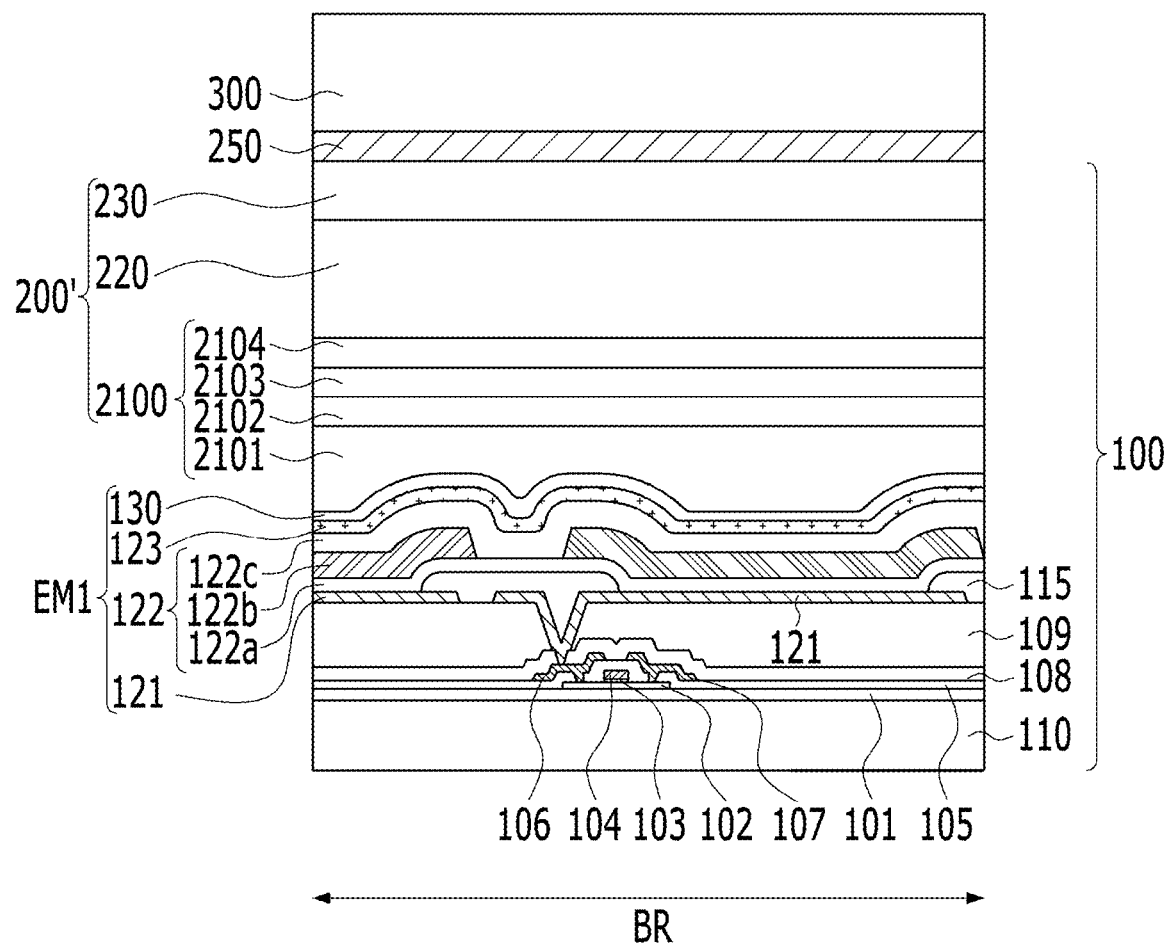

Next, FIGS. 5A and 5B are cross-sectional views illustrating the flat portion and the bending portion of the flexible display device according to an embodiment of the present invention. As illustrated in FIGS. 5A and 5B, the flat portion FR and the bending portion BR have the same configuration excluding the first encapsulation unit 200 and the second encapsulation unit 200'.

In FIGS. 5A and 5B, a thin-film transistor is further illustrated below each of the second emission unit EM2 and the first emission unit EMI described above. Specifically, a thin-film transistor TFT is formed after a buffer layer 101 is provided on the substrate 110. The thin-film transistor includes a semiconductor layer 102 disposed on a predetermined region of the buffer layer 101, a gate insulation layer 103 and a gate electrode 104 disposed in that order on a portion of the semiconductor layer 102, and a source electrode 106 and a drain electrode 107 connected to opposite sides of the semiconductor layer 102.

In the illustrated example, the semiconductor layer of the thin-film transistor is formed of an oxide semiconductor, but is not limited thereto. The semiconductor layer may be formed of amorphous silicon or poly-silicon, or may be formed by stacking different kinds of semiconductor layers.

An interlayer insulation layer 105 may further be provided for electrical insulation between the gate electrode 104 and the source electrode 106 or the drain electrode 107. Then, an inorganic protective layer 108 and an organic protective layer 109 are sequentially formed so as to cover the thin-film transistor excluding a portion of the upper surface of the source electrode 106 of the thin-film transistor. The first electrode 121 on the organic protective layer 109 is connected to the source electrode 106, which is exposed through a contact hole formed by removing a portion of the organic protective layer 109 and the inorganic protective layer 108.

In order to distinguish an emission area of each subpixel in the active area AA, a bank 115 may be superimposed on a portion of the first electrode 121. In some cases, the bank 115 may be omitted.

In the field emission element described above, all of the first electrode 121, organic layers 122*a* and 122*c* excluding an emission layer 122*b*, and the second electrode 123 can be integrally formed to cover the active area AA. The emission layer 122*b* may be an organic emission layer. In some cases, when the emission layer 122*b* is a white emission layer, the emission layer 122*b* can be continuously formed over the active area AA, rather than being discretely formed. Alternatively, the emission layer 122*b* may be a quantum-dot emission layer containing an inorganic semiconductor. In this instance, a quantum-dot light-emitting element can be operated by an electrical field between the first electrode 121 and the second electrode 123.

In the illustrated example, the organic layer 122 includes a first common layer 122*a*, an emission layer 122*b*, and a second common layer 122*c*, but is not limited thereto. A common layer may be added as needed, and in some cases, the first and second common layers 122a and 122c can have different thicknesses on a subpixel basis based on the color of the emission layer 122b of each subpixel, or may be disposed only in a selected area.

The capping layer 130 is also formed on the second electrode 123 in order to protect the field emission element. Further, the first protective layer 210 and the first layer 2101 of the optical stack 2100 are formed in contact with the capping layer 130 so as to correspond to the flat portion FR and the bending portion BR.

As shown, the optical stack 2100 located in the bending portion BR includes the first to fourth layers 2101, 2102, 2103 and 2104 so that a difference in index of refraction between adjacent layers is 0.1 or more, but is not limited thereto. Further, the efficiency of out-coupling of the bending portion BR can be increased over that of the first protective layer 210 as long as the optical stack 2100 includes two or more interfaces having different indices of refraction.

The optical stack 2100 and the first protective layer 210 are illustrated in FIGS. 5A and 5B as having the same thickness, but are not limited thereto, and one of them may be thicker than the other. In addition, the thickness of the first protective layer 210 and the optical stack 2100 ranges from 0.8 μm to 3 μm. When the surfaces of the optical stack 2100 and the first protective layer 210 are not flat due to a height difference between layers thereunder, the second protective layer 220, which is an organic layer, is provided on the optical stack 2100 and the first protective layer 210 so that the entire surface above the second protective layer 220 is planarized.

Then, the third protective layer 230, which is an inorganic layer, is further provided on the second protective layer 220 to prevent moisture permeation. The third protective layer 230 may be formed using the same material as the first protective layer 210 may have a thickness ranging from 1 μm to 3 μm.

Here, the first encapsulation unit 200, which includes the first to third protective layers 210, 220 and 230, is formed in the flat portion FR, and the second encapsulation unit 200', in which the optical stack 2100, the second protective layer 220, and the third protective layer 230 are sequentially stacked, is provided in the bending portion BR. In addition, the third protective layer 230 may be formed in the peripheral area (see "NA" in FIG. 1) so as to cover the second protective layer 220 in order to protect the side surface of the light-emitting display panel 100.

As described above, the light-emitting display panel 100 includes the thin-film transistor, the emission units EM1 and EM2, and the encapsulation units 200 and 200', which are formed on the substrate 110. In addition, the light-emitting display panel 100 can be attached to the glass cover 300, described with reference to FIGS. 1 and 2, via an adhesive layer 250.

Hereinafter, luminance deterioration in two bending portions having different radii of curvature according to comparative examples will be described. First, the term "curvature" is the degree by which an object bends, and is the inverse of a radius r of a virtual circle drawn by an "arc" of a region having a curvature. Thus, the radius of curvature is the inverse of the curvature.

In addition, the radius of curvature of 1 R indicates that the radius of a virtual circle drawn by the arc of a region having a curvature is 1 mm. The greater the radius of curvature, the smaller the curvature. The radii of curvature of 3.7 R and 6 R will be described. A first form and a second form of comparative examples differ from each other only in the radius of curvature, and adopt a single first protective layer in both the bending portion and the flat portion.

A flexible display device according to the comparative examples adopts the same structure in both the flat portion and the bending portion, unlike the flexible display device according to an embodiment of the present invention described above. That is, the bending portion is not provided with the optical stack, and the first protective layer 210 is provided on both the bending portion and the flat portion.

Figure 6A:
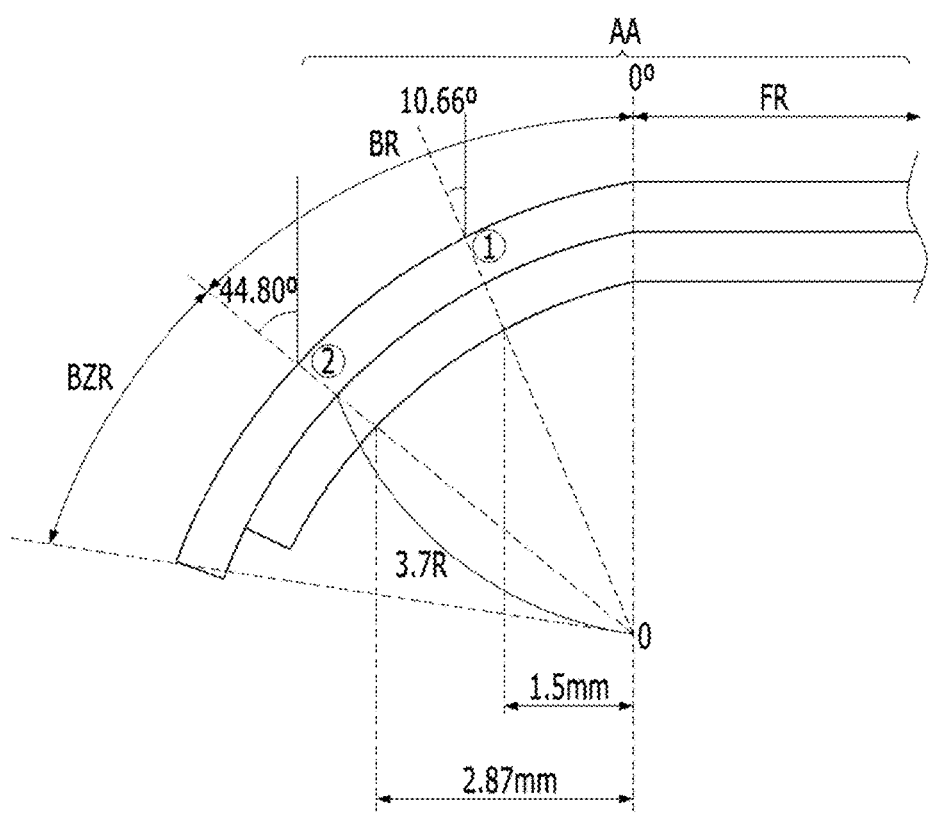
FIG. 6A is a cross-sectional view illustrating a flexible display device having a radius of curvature of 3.7 R according to a first form of a comparative example.
Figure 6B:
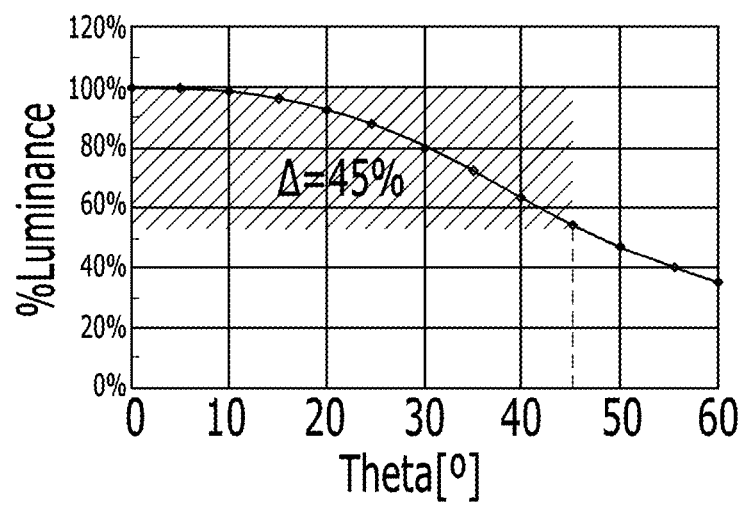
FIG. 6B is a graph illustrating luminance deterioration attributable to variation in the viewing angle in a bending portion of FIG. 6A.
Figure 6C:
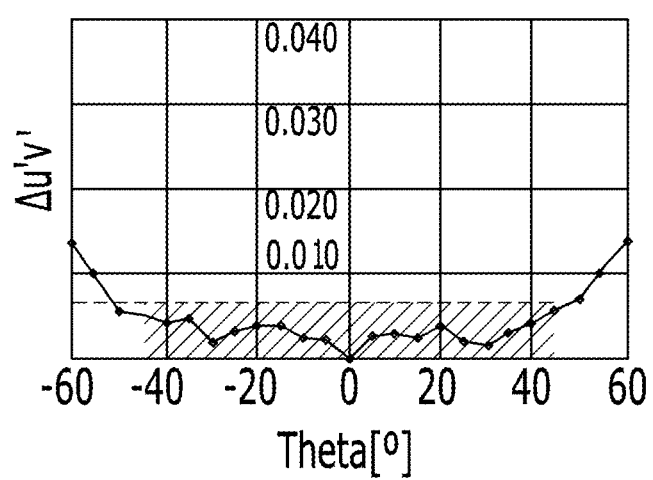
FIG. 6C is a graph illustrating variation $\Delta u'v'$ in the viewing angle in the bending portion of FIG. 6A.

FIG. 6A is a cross-sectional view illustrating a flexible display device having a radius of curvature of 3.7 R according to a first form of a comparative example, FIG. 6B is a graph illustrating luminance deterioration attributable to variation in the viewing angle in a bending portion of FIG. 6A, and FIG. 6C is a graph illustrating variation Δu'v' in the viewing angle in the bending portion of FIG. 6A.

As illustrated in FIG. 6A, in the flexible display device having a radius of curvature of 3.7 R according to the first form of the comparative example, the radius of curvature is small, and thus the curvature is sharp, and the viewing angle ranges from 0° at the boundary of the bending portion BR and the flat portion FR to 44.80° at the boundary of the bending portion BR and the bezel area BZR. In this instance, it is observed that the bending portion BR, which has a steep slope and a short length, protrudes to a region (region ②) at a straight distance of 2.87 mm from the edge of the flat portion FR. In this instance, it is also observed that the center (region ①) of the curvature of the bending portion BR exhibits a viewing angle of 10.66°, and protrudes to a region at a straight distance of 1.55 mm from the edge of the flat portion FR.

Referring to FIG. 6B, a loss of luminance of 45% compared to the luminance of the flat portion FR occurs at the viewing angle of 44.80° in the bending portion BR. Referring to FIG. 6C, Δu'v', which indicates a difference between the viewing angle in the flat portion FR and the viewing angle of 44.80° in the bending portion BR, is about 0.007.

Figure 7A:
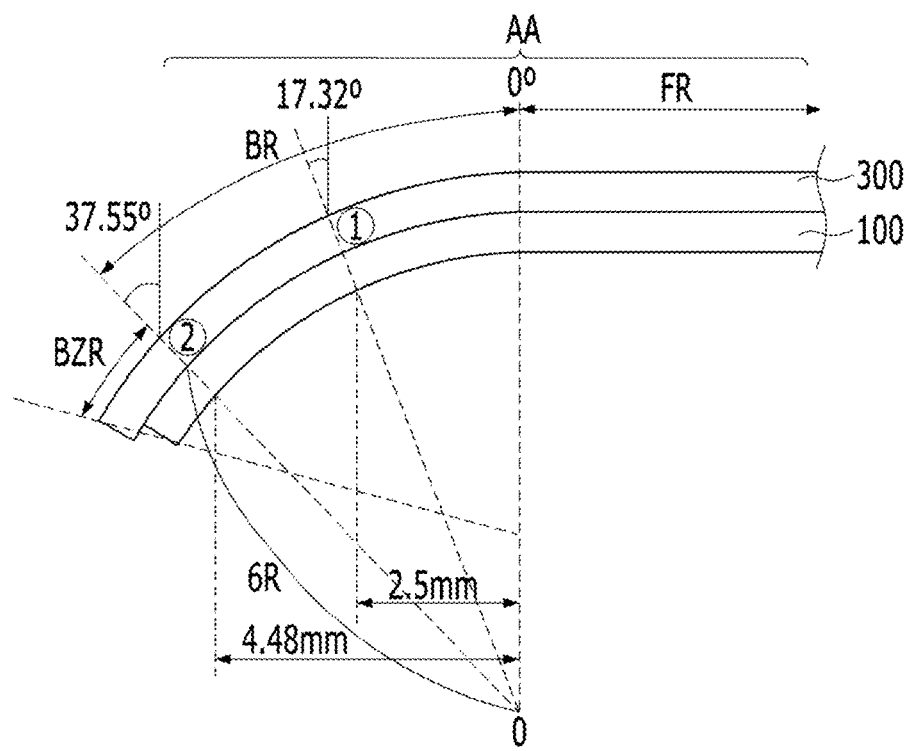
FIG. 7A is a cross-sectional view illustrating a flexible display device having a radius of curvature of 6 R according to a second form of a comparative example.
Figure 7B:
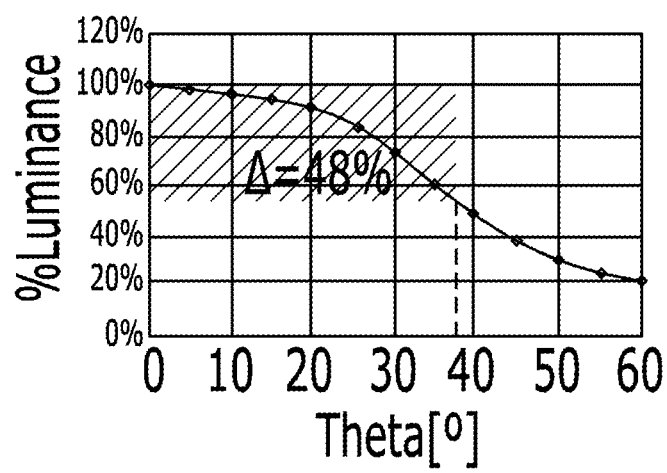
FIG. 7B is a graph illustrating luminance deterioration attributable to variation in the viewing angle in a bending portion of FIG. 7A.
Figure 7C:
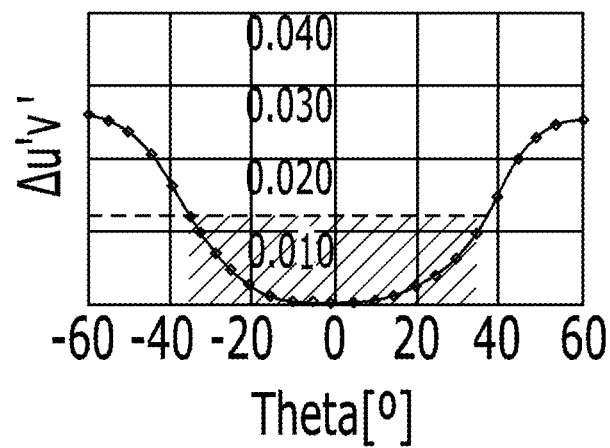
FIG. 7C is a graph illustrating variation $\Delta u'v'$ in the viewing angle in the bending portion of FIG. 7A.

Next, FIG. 7A is a cross-sectional view illustrating a flexible display device having a radius of curvature of 6 R according to a second form of a comparative example, FIG. 7B is a graph illustrating luminance deterioration attributable to variation in the viewing angle in a bending portion of FIG. 7A, and FIG. 7C is a graph illustrating variation Δu'v' in the viewing angle in the bending portion of FIG. 7A.

As illustrated in FIG. 7A, in the flexible display device having a radius of curvature of 6 R according to the second form of the comparative example, the slope of the bending portion BR is gentle and the viewing angle ranges from 0° at the boundary of the bending portion BR and the flat portion FR to 37.55° at the boundary of the bending portion BR and the bezel area BZR. In this instance, it is observed that the bending portion BR protrudes to a region (region ②) at a straight distance of 4.48 mm from the edge of the flat portion FR. It is also observed that the center (region ①) of the curvature of the bending portion BR exhibits a viewing angle of 17.32°, and protrudes to a region at a straight distance of 2.5 mm from the edge of the flat portion FR.

In this instance, referring to FIG. 7B, a loss of luminance of 48% compared to the luminance of the flat portion FR occurs at a viewing angle of 37.55° in the bending portion BR. Referring to FIG. 7C, Δu'v', which indicates the difference between the viewing angle in the flat portion FR and the viewing angle of 37.55° in the bending portion BR, is about 0.012.

That is, when comparing the first form and the second form of the comparative examples, it can be determined that luminance deterioration or variation in the viewing angle in the bending portion BR is reduced when the bending portion has a smaller radius of curvature and occupies a smaller area, as in the first form of the comparative example.

However, demand for flexible display devices having various curvatures is gradually increasing. That is, a product in which the bending portion BR needs to have a width of 3 mm or more and a product in which the bending portion BR has a gentle curvature such that the radius of curvature is 4 R or more as illustrated in FIG. 7A are being released. In addition, the bending portion, which has a gentle curvature or a large width, also requires luminance similar to that in the flat portion, without luminance deterioration attributable to variation in the viewing angle.

In particular, in the flexible display device according to an embodiment of the present invention, the bending portion BR is changed in structure such that the width thereof is 4 mm or more and such that the curvature thereof has a gentle value, which more effectively and noticeably prevents luminance deterioration attributable to the noticeably curved structure of the bending portion BR.

Figure 8:
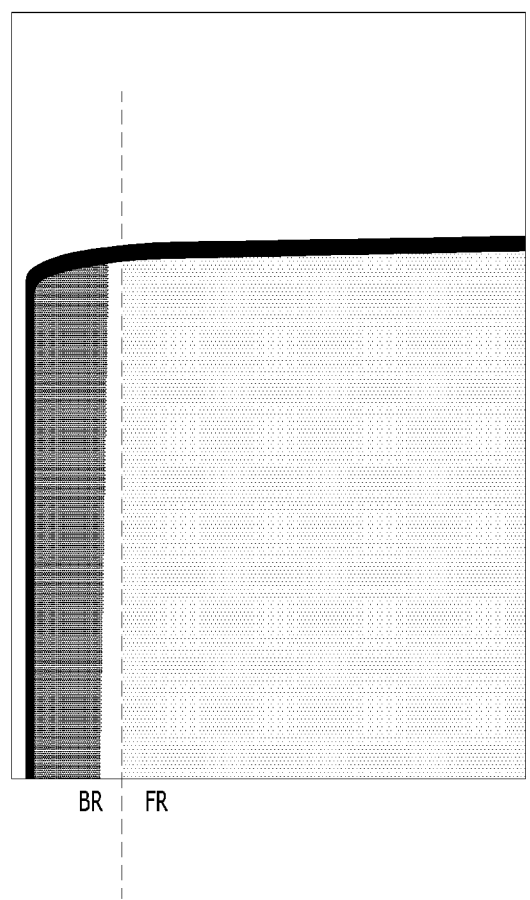
FIG. 8 is a photograph illustrating both the flat portion and the bending portion of the flexible display device according to the comparative example.

FIG. 8 is a photograph illustrating both the flat portion and the bending portion of the flexible display device according to the second form of the comparative example. As illustrated in FIG. 8, when the bending portion BR has a width of 4 mm or more and a radius of curvature of 6 R, and thus has a noticeably curved structure as in the second form of the comparative example, it can be confirmed that the bending portion BR appears in a dark strip form under the assumption that the flat portion and the bending portion adopt the same configuration of encapsulation unit, in which an inorganic layer, an organic layer, and an inorganic layer are sequentially stacked.

The flexible display device according to an embodiment of the present invention solves this problem. In the flexible display device of the comparative example, due to the curvature of the bending portion BR, the viewing angle in the bending portion BR rapidly varies from the region of the bending portion that is in contact with the flat portion to the region of the bending portion that is in contact with the peripheral area. The bending portion BR has a width of 10 mm or less, and is smaller than the flat portion FR. Therefore, when the optical stack 2100 is not used and the first protective layer 210, which is used in the flat portion FR, is also used in the bending portion BR, when a user views the flat portion FR and the bending portion BR together, the entire bending portion BR is perceived as an area in which the viewing angle rapidly varies and a dark strip appears in the bending portion BR.

In the flexible display device according to an embodiment of the present invention, as illustrated in FIGS. 3 and 4, the optical stack 2100 is provided on the first emission unit EM1 to increase out-coupling efficiency compared to that in the flat portion FR so as to compensate for luminance deterioration in the area in which the viewing angle rapidly varies. Thereby, no strip is observed in the bending portion BR, and the bending portion BR is observed as having luminance similar to that in the flat portion FR. Thus, a phenomenon in which any specific area is prominent is prevented.

In addition, the optical stack 2100 functions to prevent moisture permeation, like the first protective layer 210, except that it also functions to increase the efficiency of reflection at inner interfaces thereof. Thus, even if the optical stack 2100 is formed by stacking a plurality of layers having different indices of refraction, the total thickness may be similar to or equal to that of the first protective layer 210. Here, the layers of the optical stack 2100 can be stacked using a mask having an opening only in the bending portion BR, so that an inorganic material can be selectively stacked only in the bending portion BR. That is, the respective layers can be sequentially stacked using the same mask with a difference in the sources of the respective layers.

Further, at least one layer of the optical stack 2100 in the bending portion BR may be formed of the same material as the first protective layer 210. In this instance, since the layer in the bending portion BR and the first protective layer 210 have different thicknesses even if they are formed of the same material, a mask for the optical stack 2100 in the bending portion BR and a mask for the first protective layer 210 in the flat portion FR may differ from each other.

In addition, the material of each layer in the optical stack 2100 in the bending portion BR can be selected to have an index of refraction within a range from 1.6 to 2.3. In order to achieve inner reflection at the interface between the optical stack 2100 and the capping layer 130 in addition to inner reflection in the optical stack 2100, a difference in index of refraction between the capping layer 130 and the first layer 2101 of the optical stack 2100 may be 0.1 or more. More particularly, the difference in index of refraction may be 0.14 or more.

Further, the second protective layer 220, which is an organic layer, and the third protective layer 230 of the first and second encapsulation units 200 and 200', are provided in the flat portion FR and the bending portion BR in common. The second protective layer 220 is also directly in contact with the upper surfaces of the optical stack 2100 and the first protective layer 210. In addition, the third protective layer 230 is wider than the second protective layer 220 so as to sufficiently cover the second protective layer 220, thereby effectively preventing moisture permeation from the outside to the upper surface and the side surface of the second protective layer 220.

Figure 9:
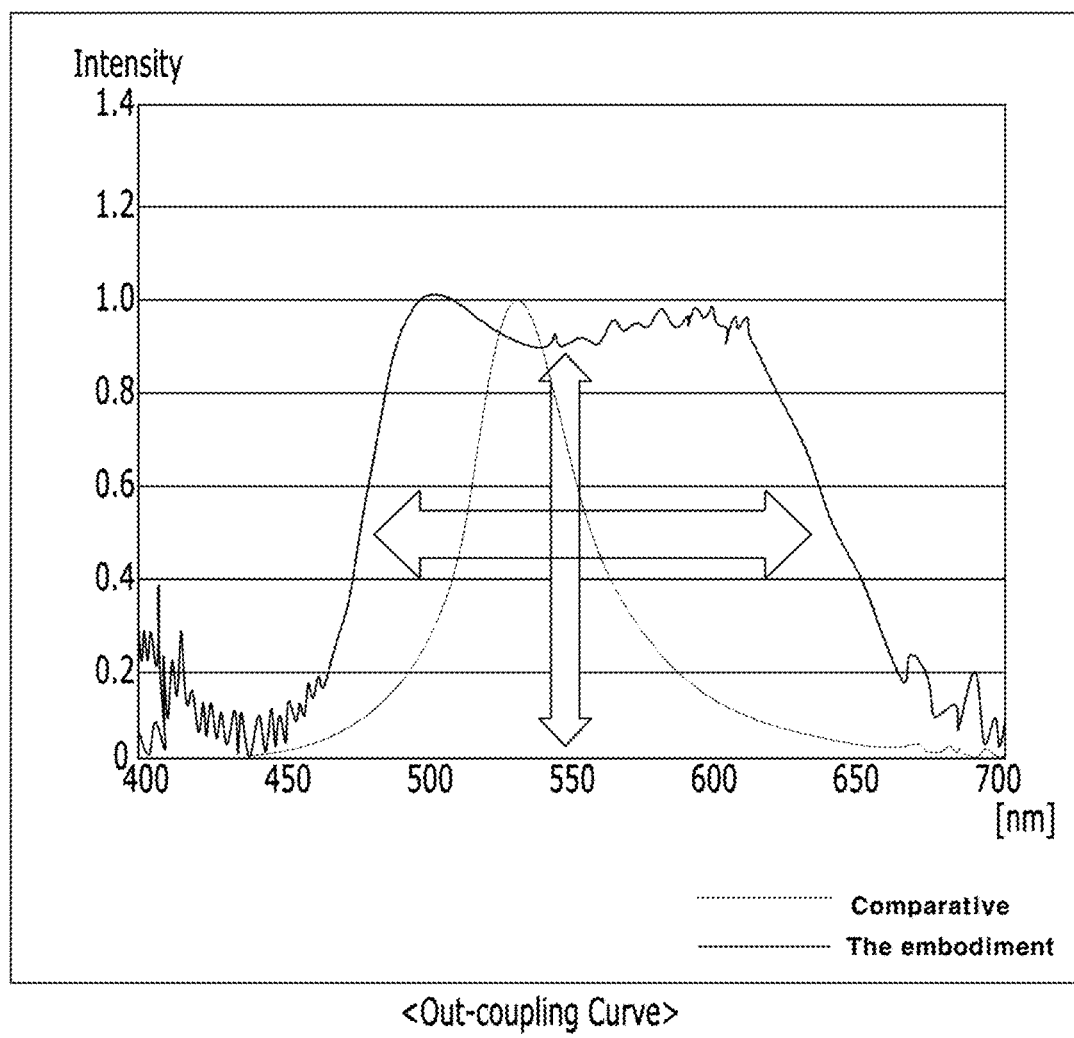
FIG. 9 is a graph illustrating the out-coupling characteristics of the bending portion of the comparative example and the bending portion according to an embodiment of the present invention.

Next, FIG. 9 is a graph illustrating the out-coupling characteristics of the bending portion of the comparative example and the bending portion according to an embodiment of the present invention. Referring to FIG. 9, when comparing the comparative example, in which the flat portion and the bending portion include the same configuration of an encapsulation unit (including a first protective layer as an inorganic layer, a second protective layer as an organic layer, and a third protective layer as an inorganic layer, as in FIG. 5A) without realizing a difference in index of refraction at the interface with the present invention, in which the bending portion BR includes the optical stack on the emission unit EM1, unlike the flat portion FR, as illustrated in FIGS. 1 to 5B, the structure of the comparative example exhibits a narrow out-coupling spectrum, whereas the structure according to an embodiment of the present invention exhibits an out-coupling spectrum that is at least twice as wide.

Considering a wavelength range exhibiting a full width at half maximum (FWHM), the FWHM appears within a wavelength range from 520 nm to 530 nm in the comparative example, whereas the FWHM is almost even across the entire visible light range in the present invention. That is, when the optical stack is provided in the bending portion BR according to the present invention, light emission is implemented with the out-coupling efficiency evenly improved across the entire visible light range.

In the experimentation of the present invention, the optical stack including four layers illustrated in FIGS. 3 and 4 is used, and is formed by stacking the first layer 2101 having a first index of refraction (n1=1.940), the second layer 2102 having a second index of refraction (n2=1.698), the third layer 2103 having a third index of refraction (n3=1.853), and the fourth layer 2104 having a fourth index of refraction (n4=1.719). In addition, the optical stack is at least improved in the out-coupling light emission characteristics of a visible light range.

In the comparative example, in the same manner as the flat portion FR of FIG. 3, the first protective layer 210 of the encapsulation unit 200 is provided in the bending portion BR. That is, in the comparative example, a difference in index of refraction is not realized in the encapsulation unit, and thus the flat portion FR and the bending portion BR have the same luminous efficacy. In this instance, when the bending portion BR is curved to have a predetermined radius of curvature, as illustrated in FIG. 8, luminance deterioration occurs due to variation in the viewing angle in the bending portion BR, which causes the bending portion BR to appear dark.

Further, in the flexible display device according to an embodiment of the present invention, the optical stack is added to the encapsulation unit in the bending portion BR to increase luminance in the bending portion BR compared to that in the flat portion FR, which prevents the curved bending portion B from appearing dark due to variation in the viewing angle.

Hereinafter, a first experimental example, in which a double layer structure of SiNx having a thickness of 0.9 μm and SiOx having a thickness of 0.1 μm is provided as the first protective layer in the flat portion, and a second experimental example, in which a three layer structure of SiNx having a thickness of 500 nm (0.5 μm), SiONx having a thickness of 200 nm (0.2 μm), and SiOx having a thickness of 300 nm (0.3 μm) is provided as the first protective layer in the flat portion, will be described. The first experimental example does not consider a difference in index of refraction, and the second experimental example sets a difference in index of refraction between respective layers to 0.1 or more.

Figure 10:
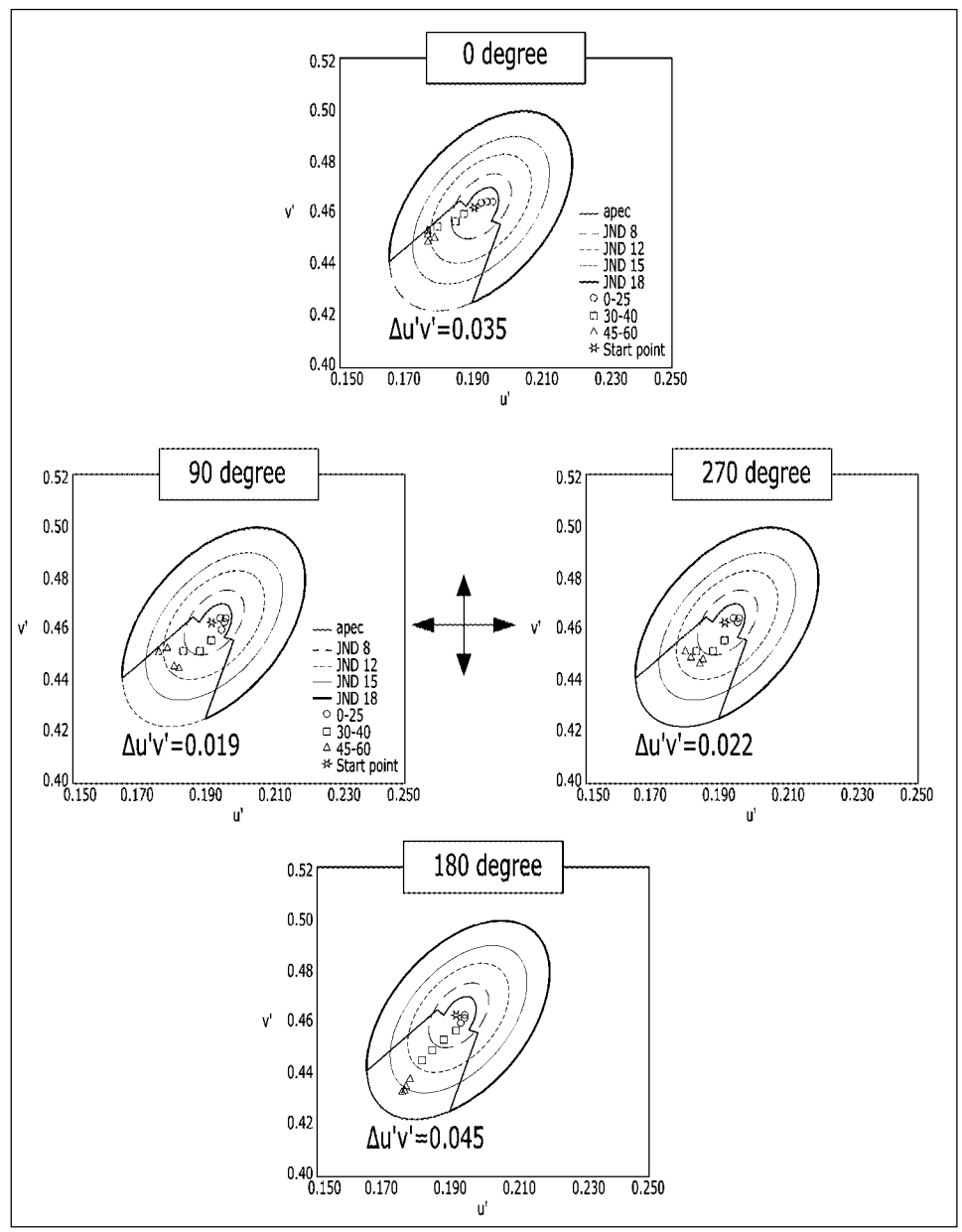
FIG. 10 is a graph illustrating Δu'v' in the vertical and horizontal directions of a structure having interfaces with a single difference in index of refraction.
Figure 11:
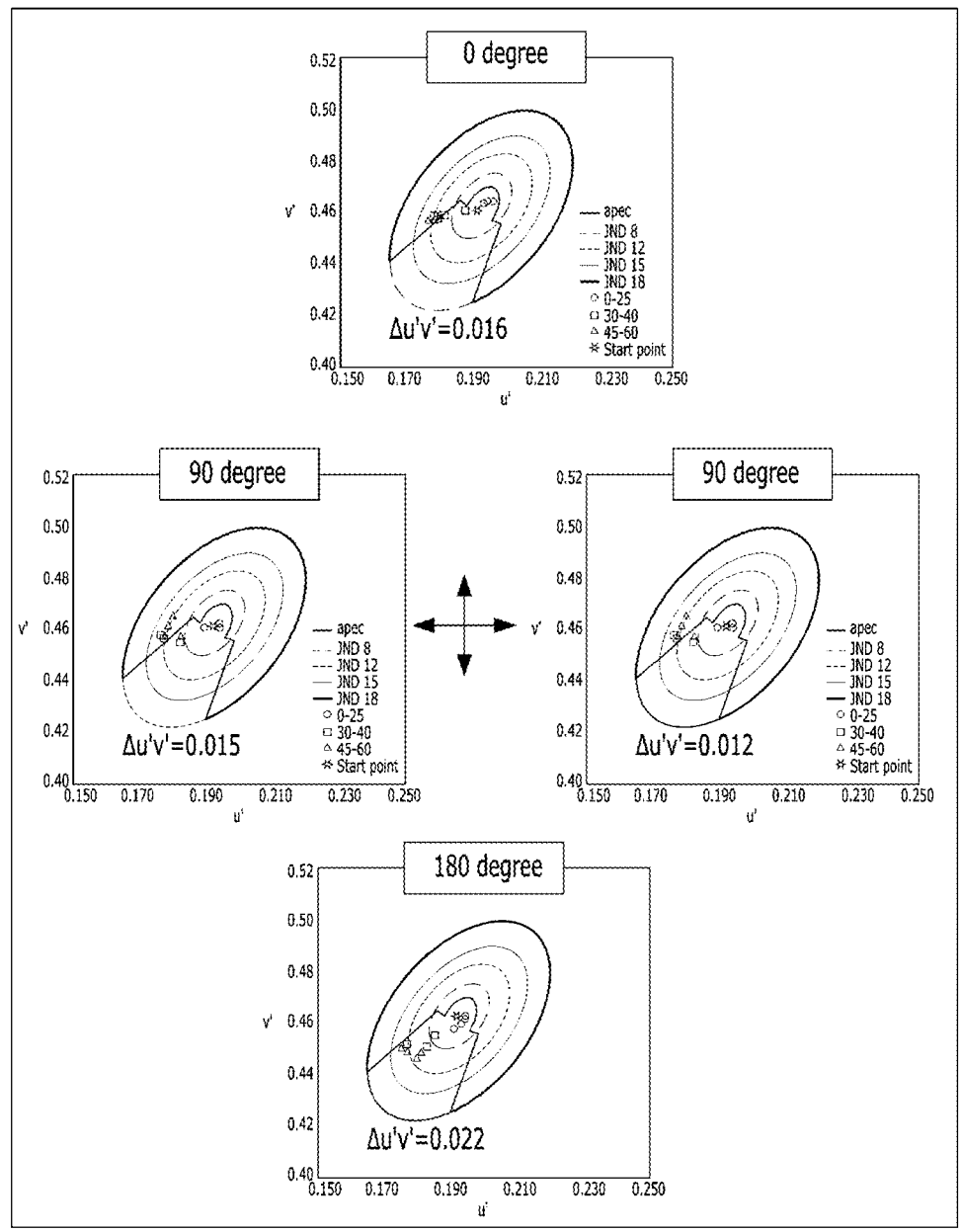
FIG. 11 is a graph illustrating Δu'v' in the vertical and horizontal directions of a structure having interfaces with double differences in the index of refraction.

FIG. 10 is a graph illustrating Δu'v' in the vertical and horizontal directions of a structure having a single interface with a difference in index of refraction, and FIG. 11 is a graph illustrating Δu'v' in the vertical and horizontal directions of a structure having double interfaces with a difference in index of refraction.

As illustrated in FIG. 10, in the structure having a single interface with a difference in index of refraction according to the first experimental example, the upper, lower, left, and right positions correspond to 0 degrees, 180 degrees, 90 degrees, and 270 degrees, respectively, and variation in the viewing angle Δu'v' at each position is the product of u' and v', and has values of 0.035, 0.045, 0.019, and 0.022 at the respective positions.

As illustrated in FIG. 11, in the structure having double interfaces with a difference in index of refraction according to the second experimental example, variation in the viewing angle Δu'v' at the upper, lower, left, and right positions are 0.016, 0.022, 0.015, and 0.012, which are remarkably reduced compared to those in the first experimental example. That is, it can be found that variation in the viewing angle is reduced when the optical stack includes two or more interfaces having different indices of refraction.

The first and second experimental examples illustrate when the viewing angle varies extremely by 90 degrees in each direction, and in an actual flexible display device, the bending portion may be curved such that the viewing angle varies within 45 degrees. Thus, it can be expected that the bending portion of the flexible display device exhibits variation in the viewing angle below the maximum variation in the viewing angle Δu'v' of 0.015 and the maximum variation in the viewing angle Δu'v' of 0.012 in left and right directions of FIG. 11.

TABLE 1

| Classification | | First Experimental Example | Second Experimental Example |
|---|---|---|---|
| Efficiency (Cd/A) | W | 40.0 | 36.0 |
| | R | 53.7 | 53.8 |
| | G | 110.7 | 112.2 |
| | B | 4.8 | 4.0 |
| Viewing Angle | Δu'v' | 0.035/0.045/0.019/0.022 (0.030) | 0.016/0.022/0.015/0.012 (0.016) |
| | JND | 13/16/13/11 (13/25) | 13/14/14/8 (12.25) |

Referring to Table 1, in particular, it can be found that the second experimental example exhibits substantially the same efficiency as the first experimental example, but reduces variation in the viewing angle by approximately two times compared to that in the first experimental example. Here, a "Just Noticeable Difference (JND)" is attributable to variation in the viewing angle that can be naturally observed, and the values thereof in Table 1 are reduced by 1 or more from the average in each direction. Accordingly, it can be found that variation in the viewing angle is reduced sufficiently to be noticeable by a user in the second experimental example compared to that in the first experimental example.

As is apparent from the above description, a flexible display device according to an embodiment of the present invention has the following advantages. First, in the structure in which a bending portion having a predetermined width or more, by providing an encapsulation unit having an optical stack in the bending portion, the luminance of the bending portion, in which variation in the viewing angle occurs, can be maintained at a level equivalent to that of a flat portion. Accordingly, it is possible to prevent the bending portion from appearing dark.

Second, by providing the encapsulation unit having the optical stack in the bending portion, which has a gentle curvature, the luminance of the bending portion, in which variation in the viewing angle occurs, can be increased to a level equivalent to that of a flat portion.

Third, by selectively providing the optical stack in the bending portion, the flexible display device according to an embodiment of the present invention can be employed in various applications in which the display device includes a bending portion in any of various regions thereof, and can control out-coupling efficiency in various manners by adjusting the number of interfaces that have a difference in index of refraction so as to correspond to various curvatures of the bending portion.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Thus, such modifications should be considered to fall within the scope of the present invention, and the true technical scope of the present invention should be determined by the technical ideas of the claims to be set forth below.

What is claimed is:

1. A flexible display device, comprising:
a substrate including an active area having a bending portion and a flat portion, and a peripheral area surrounding the active area;
a first emission unit located in the bending portion;
a second emission unit located in the flat portion;
a first protective layer covering the second emission unit;
an optical stack covering the first emission unit and including two or more interfaces having a difference in an index of refraction of 0.1 or more; and
a second protective layer covering both the first protective layer and the optical stack.

2. The flexible display device according to claim 1, wherein each of the first emission unit and the second emission unit comprises:
a first electrode and a second electrode opposing each other;
at least one emission layer between the first electrode and the second electrode; and
a capping layer on the second electrode.

3. The flexible display device according to claim 2, wherein the capping layer contacts the first protective layer and the optical stack.

4. The flexible display device according to claim 2, wherein the optical stack comprises:
a first optical layer contacting the capping layer and having a first index of refraction;
a second optical layer disposed on the first optical layer and having a second index of refraction, which is smaller than the first index of refraction by 1.0 or more; and
a third optical layer disposed on the second optical layer and having a third index of refraction, which is larger than the second index of refraction by 1.0 or more.

5. The flexible display device according to claim 4, wherein the first optical layer and the capping layer have a difference in index of refraction of 0.1 or more.

6. The flexible display device according to claim 4, wherein the first to third optical layers and the first protective layer include at least one of a silicon oxide layer, a silicon nitride layer, a silicon oxide nitride layer, and a metal oxide layer.

7. The flexible display device according to claim 4, wherein one of the first to third optical layers includes a same material as the first protective layer.

8. The flexible display device according to claim 4, wherein an index of refraction of the first to third optical layers and the first protective layer ranges from 1.6 to 2.3.

9. The flexible display device according to claim 1, wherein the bending portion is located in an edge of the active area adjacent to the peripheral area.

10. The flexible display device according to claim 1, wherein the second protective layer is an organic layer.

11. The flexible display device according to claim 1, further comprising a third protective layer covering the second protective layer and including a same material as the first protective layer.

12. The flexible display device according to claim 11, further comprising a glass cover covering the third protective layer.

13. The flexible display device according to claim 1, wherein the first protective layer and the optical stack have a same thickness.

14. The flexible display device according to claim 1, wherein the optical stack in the bending portion discharges an increased amount of light compared to the first protective layer of the flat portion.

15. The flexible display device according to claim 1, wherein the first emission unit and the second emission unit have a same thickness.

16. The flexible display device according to claim 1, wherein the second protective layer is thicker than each of the first protective layer and the optical stack.

17. The flexible display device according to claim 1, wherein the optical stack comprises a plurality of inorganic layers having two or more interfaces having the difference index of refraction causing repeated emission and reflection of light at the two or more interfaces.

18. A flexible display device, comprising:
a substrate including an active area having a flat portion and first and second edge-bending portions at opposite sides of the flat portion, and a peripheral area surrounding the active area;
a first emission unit located in the first and second edge-bending portions;
a second emission unit located in the flat portion;
a first protective layer covering the second emission unit;
an optical stack covering the first emission unit and including two or more interfaces having a difference in an index of refraction of 0.1 or more; and
a second protective layer covering the first protective layer and the optical stack together.

19. The flexible display device according to claim 18, wherein an angle between a normal line at an outermost region of the bending portion and a normal line at the flat portion ranges from 20° to 50°.

20. The flexible display device according to claim 18, wherein the bending portion has a width of 4 mm or more.

* * * * *